United States Patent
Bobick

(10) Patent No.: US 11,408,920 B2
(45) Date of Patent: Aug. 9, 2022

(54) CROSSTALK CANCELATION FOR ELECTRICITY METERING

(71) Applicant: Landis+Gyr Innovations, Inc., Alpharetta, GA (US)

(72) Inventor: David Bobick, West Lafayette, IN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 350 days.

(21) Appl. No.: 16/671,422

(22) Filed: Nov. 1, 2019

(65) Prior Publication Data

US 2021/0132124 A1 May 6, 2021

(51) Int. Cl.
*G01R 22/06* (2006.01)
*G01R 15/14* (2006.01)
*G01R 19/25* (2006.01)

(52) U.S. Cl.
CPC ......... *G01R 22/061* (2013.01); *G01R 15/142* (2013.01); *G01R 19/2513* (2013.01)

(58) Field of Classification Search
CPC . G01R 15/142; G01R 19/2513; G01R 35/005
See application file for complete search history.

(56) References Cited

U.S. PATENT DOCUMENTS

| | | |
|---|---|---|
| 2002/0180459 A1 | 12/2002 | Skendzic et al. |
| 2002/0190705 A1 | 12/2002 | Skendzic et al. |
| 2008/0172192 A1* | 7/2008 | Banhegyesi ........... G01R 22/10 702/61 |
| 2011/0267038 A1* | 11/2011 | Homma ................. G01R 1/203 324/126 |

(Continued)

FOREIGN PATENT DOCUMENTS

| | | |
|---|---|---|
| CN | 103076493 | 5/2013 |
| CN | 107664710 | 2/2018 |

OTHER PUBLICATIONS

Fu et al., "Crosstalk Calibration For High Precision Power Measurement", 2015 IEEE Energy Conversion Congress and Exposition (ECCE), IEEE, Sep. 20, 2015, pp. 6589-6593.

(Continued)

*Primary Examiner* — Michael J Dalbo
(74) *Attorney, Agent, or Firm* — Kilpatrick Townsend & Stockton LLP

(57) ABSTRACT

A system for crosstalk cancelation for electricity metering in a power distribution network is provided. For example, a meter can be used to generate a set of measurement points by measuring electrical signals provided by a reference power device according to a set of source points. Based on the set of source points and the corresponding set of measurement points, a crosstalk cancelation function is derived and stored in the meter. When the meter is deployed at a geographical location and generates a measurement point by measuring the electrical signal on the power distribution network, the meter further applies the crosstalk cancelation function to the measurement point to generate a transformed measurement point. The meter calculates various characteristics of the power distribution network based on the transformed measurement points and transmits the calculated characteristics to a headend system.

20 Claims, 6 Drawing Sheets

(56) References Cited

U.S. PATENT DOCUMENTS

| | | | | |
|---|---|---|---|---|
| 2012/0182157 A1* | 7/2012 | Carr | ................ | H04Q 9/00 |
| | | | | 340/870.02 |
| 2012/0221265 A1* | 8/2012 | Arya | ................ | G01R 29/18 |
| | | | | 702/61 |
| 2013/0302031 A1 | 11/2013 | Tanimura et al. | | |
| 2015/0326278 A1* | 11/2015 | Maes | ................ | H04B 3/32 |
| | | | | 370/201 |
| 2015/0331079 A1* | 11/2015 | Kolwalkar | ........ | G01R 19/2503 |
| | | | | 702/104 |
| 2017/0269134 A1* | 9/2017 | Fu | ................ | G01R 35/005 |
| 2019/0052080 A1* | 2/2019 | Kuloor | ............. | H02J 3/00 |
| 2019/0252134 A1* | 8/2019 | Haes | ................ | H01H 9/56 |

OTHER PUBLICATIONS

Lorek et al., "COTS-Based Stick-on Electricity Meters for Building Submetering", IEEE Sensors Journal, IEEE Service Center, New York, vol. 14, No. 10, Oct. 1, 2014, 4 pages.
International Patent Application No. PCT/US2020/057674, International Search Report and Written Opinion, dated Jan. 12, 2021, 13 pages.

* cited by examiner

CROSSTALK CANCELATION FOR ELECTRICITY METERING

TECHNICAL FIELD

This disclosure relates generally to electricity metering for a power distribution network. More particularly, this disclosure relates to improving the measurement accuracy of electricity metering by reducing or eliminating channel crosstalk from measurement data of a power distribution network.

BACKGROUND

In a power distribution network, such as an electric grid, electricity meters installed at endpoints of the distribution network are typically configured to measure various characteristics associated with the distribution network, such as the power consumption at an endpoint within a certain period of time, a peak voltage of the electrical signal measured at the endpoint, and so on.

A major component affecting the measurement accuracy of electricity metering is the channel crosstalk. The channel crosstalk is a phenomenon by which a signal transmitted on one circuit or channel of a transmission system creates an undesired effect in another circuit or channel. Crosstalk is usually caused by undesired capacitive, inductive, or conductive coupling from one circuit, part of a circuit, or channel, to another. If the channel crosstalk is not properly handled, the various characteristics measured by the electricity meters will be inaccurate and thus rendered useless.

SUMMARY

Aspects and examples are disclosed for apparatuses and processes for crosstalk cancelation for electricity metering. For instance, a device connected to a power distribution network includes a measurement circuitry configured to measure a voltage and a current on at least one phase of the power distribution network, a processor configured to execute computer-readable instructions, and a memory configured to store a crosstalk cancelation function that reduces crosstalk effects of the measurement circuitry and the computer-readable instructions. When the computer-readable instructions are executed by the processor, the process performs operations including obtaining a measurement point from the measurement circuitry. The measurement point includes at least a voltage value and a current value, each of the voltage value and the current value including a magnitude and a phase. The operations further include transforming the measurement point to obtain a transformed measurement point by applying the crosstalk cancelation function to the measurement point. The crosstalk cancelation function is applied to both the magnitudes and the phases of the voltage value and the current value. The operations also include determining at least a characteristic of the power distribution network based on at least the transformed measurement point, and causing the characteristic of the power distribution network to be transmitted to a remote device.

In another example, a method for reducing crosstalk in measurement data of a power distribution network includes obtaining, by a meter connected to a power distribution network, a measurement point. The measurement point includes at least a voltage value and a current value on at least one phase of the power distribution network. Each of the voltage value and the current value is determined by a magnitude and a phase of the respective value. The method further includes transforming, by the meter, the measurement point to obtain a transformed measurement point by applying a crosstalk cancelation function to the measurement point. The crosstalk cancelation function reduces crosstalk effects of the meter and is applied to both magnitudes and phases of the voltage value and the current value. The method further includes determining, by the meter, at least one characteristic of the power distribution network based on at least the transformed measurement point, and causing, by the meter, the characteristic of the power distribution network to be transmitted to a remote device.

In an additional example, a meter of a power distribution network includes a metrology module configured for obtaining a measurement point for a power distribution network. The measurement point includes at least a voltage value and a current value on at least one phase of the power distribution network. The metrology module is further configured for transforming the measurement point by applying a crosstalk cancelation function to the measurement point to obtain a transformed measurement point. The crosstalk cancelation function reduces crosstalk effects of the metrology module and is applied to both magnitudes and phases of the voltage value and the current value. The metrology module is further configured for determining at least one characteristic of the power distribution network based on at least the transformed measurement point. The meter of the power distribution network further includes a communication module configured for transmitting the at least one characteristic of the power distribution network to a remote device via a mesh network.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
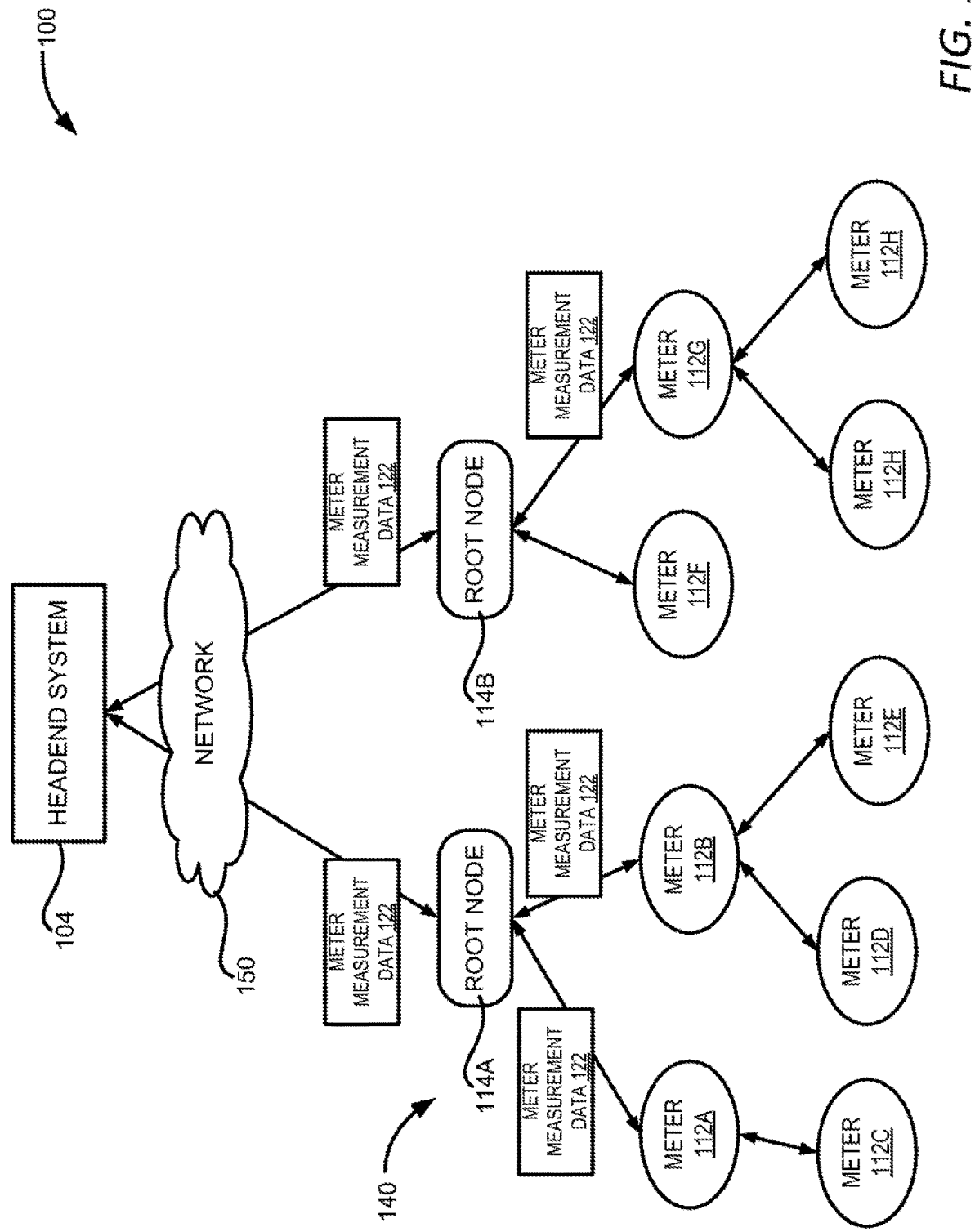
FIG. 1 is a block diagram showing an illustrative operating environment for crosstalk cancelation for electricity metering in a power distribution network, according to certain examples of the disclosure.

Systems and methods are provided for crosstalk cancelation for electricity metering in a power distribution network. Meters are deployed at various geographical locations associated with the power distribution network and are configured to measure characteristics such as power consumption at their respective locations. To measure the various characteristics of the power distribution network, a meter is configured with a measurement circuitry to measure a voltage and a current of the electrical signal on each phase of the power supply provided by the power distribution network. The meter also has access to a crosstalk cancelation function, for example, stored in a memory of the meter.

When the measurement circuitry of the meter obtains a measurement point including the measurement value for the voltage and the current, the meter applies the crosstalk cancelation function to the measurement point to generate a transformed measurement point. In some examples, the crosstalk cancelation function is applied to both the magnitude and phase of the voltage value or the current value in the measurement point. Compared with the measurement point, the transformed measurement point contains less channel crosstalk and thus more accurately reflects the values of the voltage and the current of the electrical signal.

In some examples, the crosstalk cancelation function for a meter is generated during the calibration process of the meter. A reference power source is configured to provide electrical signals to the meter according to a set of source points. The set of source points contain different combinations of magnitude and phase for the voltage values and current values. A set of measurement points corresponding to the set of source points are obtained by the meter through its measurement circuitry. In an ideal situation, i.e. when there is no channel crosstalk or other distortions, the set of measurement points should be identical to the set of source points. However, due to various distortions including the channel crosstalk, the measurement points are different from their corresponding source points. A crosstalk cancelation function can thus be obtained based on the measurement points and the source points so that it can map or transform the measurement points to the source points. For example, the crosstalk cancelation function can be determined as a linear function represented by a crosstalk cancelation matrix. Multiplying the crosstalk cancelation matrix by the set of measurement points can generate an approximation of the set of source points.

After applying the determined crosstalk cancelation function, the transformed measurement points are then utilized to derive or compute the various characteristics of the power distribution network. These characteristics are then transmitted by the meter to the headend system or other systems or nodes responsible for collecting the characteristic data of the power distribution network.

Techniques described in the present disclosure increase the accuracy of the measurement data obtained at the meters in a power distribution network by reducing or eliminating the channel crosstalk contained in each measurement point. Compared with traditional approaches where only the magnitude is considered for crosstalk cancelation, the techniques described herein improves the accuracy of the measurement data by incorporating both the magnitude and phase of the measurement points. The generated crosstalk cancelation function can scale and rotate the voltage and current values to match the crosstalk dynamics of the measurement circuitry so that the effects of the channel crosstalk is reduced or removed. As a result, any characteristic of the power distribution network that is calculated based on the measurement points, such as the power consumption, the peak voltage, and others, has higher accuracy than that computed without proper crosstalk cancelation. The accuracy of various aspects of the power distribution network can also be improved, such as the billing for users of the power distribution network, the diagnosis of issues associated with the power distribution network, the performance analysis of the power distribution network, and so on.

FIG. 1 shows an illustrative operating environment 100 for crosstalk cancelation for electricity metering in a power distribution network. The environment 100 includes a mesh network 140 associated with the power distribution network for delivering measurement data obtained by meters in the power distribution network. The mesh network 140 includes multiple electricity meters 112A-112H (which may be referred to herein individually as a meter 112 or collectively as the meters 112) deployed at various geographical locations. The meters 112 can be implemented to measure various operating characteristics of the power distribution network, such as characteristics of resource consumption or other characteristics related to power usage in the network. Example characteristics include, but are not limited to, average or total power consumption, the peak voltage of the electrical signal, power surges and load changes. In some examples, the meters 112 include commercial & industrial (C&I) meters, residential meters, and so on.

The meters 112 transmit the collected or generated data as meter measurement data 122 through the mesh network 140 to root nodes 114A and 114B (which may be referred to herein individually as a root node 114 or collectively as the root nodes 114). The root nodes 114 of the network 140 may be configured for communicating with the meters 112 to perform operations such as managing the meters 112, collecting measurement data 122 from the meters 112 and forwarding data to a headend system 104. A root node 114 can also be configured to function as a node to measure and process data itself. The root nodes 114 may be personal area network (PAN) coordinators, gateways, or any other devices capable of communicating with the headend system 104.

The root nodes 114 ultimately transmit the generated and collected meter measurement data 122 to the headend system 104 via another network 150 such as the Internet, an intranet, or any other data communication network. The headend system 104 can function as a central processing system that receives streams of data or messages from the root nodes 114. The headend system 104, or another system associated with the utility company, can process or analyze the collected data for various purposes, such as billing, performance analysis or troubleshooting.

It should be appreciated that while FIG. 1 depicts a specific network topology (e.g., a DODAG tree), other network topologies are also possible (e.g., a ring topology, a mesh topology, a star topology, etc.). In addition, although the following description will focus on the aspects of one meter 112, the technologies described herein can be applied by any meter in the mesh network, including the meters 112 and the root node 114 as long as the meter is configured to generate measurement data for the power distribution network.

Figure 2:
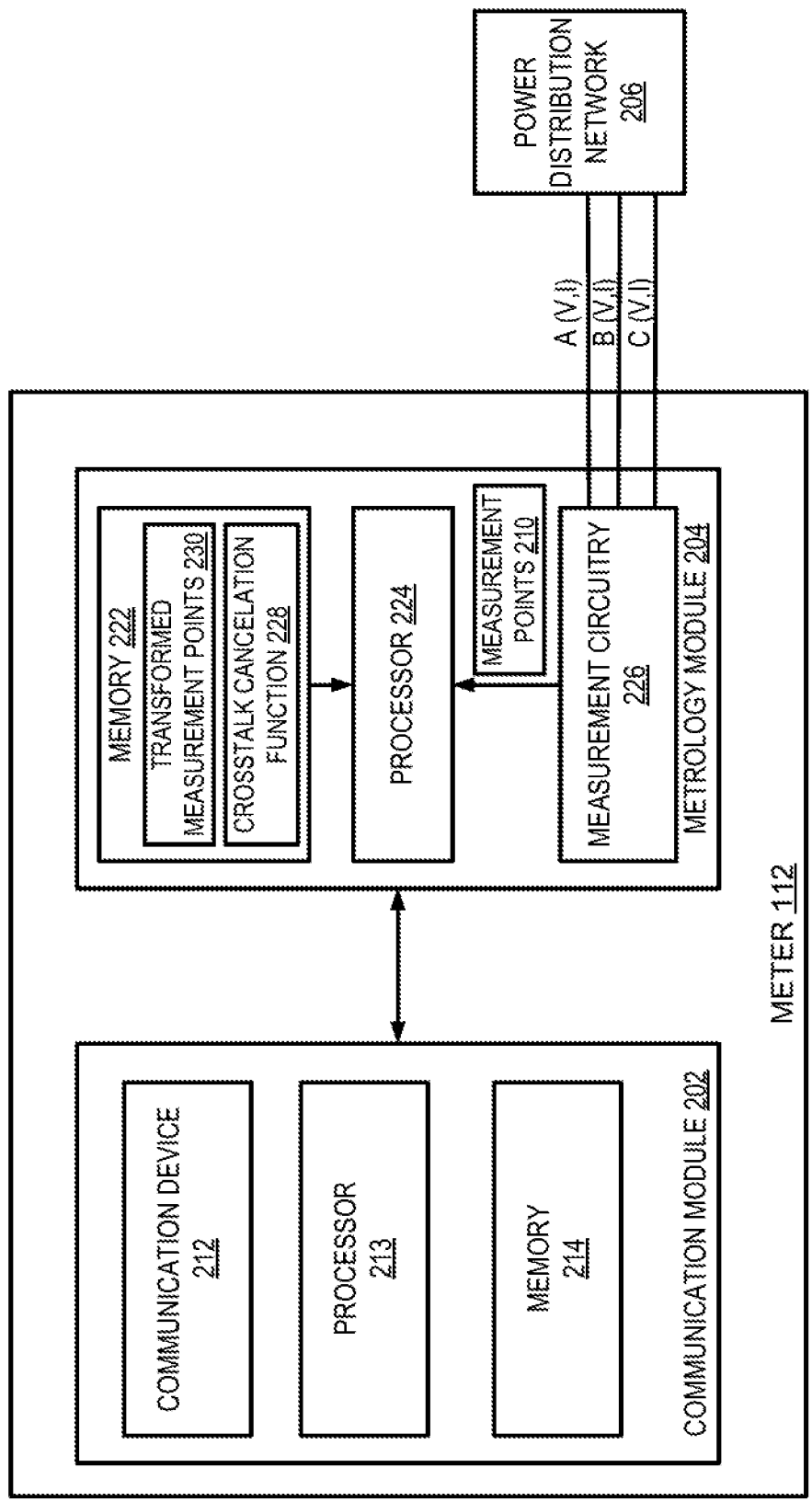
FIG. 2 is a block diagram depicting an example of a meter suitable for implementing aspects of the techniques and technologies presented herein.

FIG. 2 is a block diagram depicting an example of a meter suitable for implementing aspects of the techniques and technologies presented herein. The meter 112 includes a communication module 202 and a metrology module 204 connected through a local connection. The function of the metrology module 204 includes the functions necessary to measure and calculate characteristics of the power distribution network 206. The metrology module 204 may include a processor 224, memory 222, and measurement circuitry 226. The measurement circuitry 226 handles the measuring of the electrical signal and may also handle the recording of measurements taken. The processor 224 in the metrology module 204 controls functions performed by the metrology module 204. The memory 222 stores data needed by the processor 224 to perform its functions, such as a crosstalk cancelation function 228 used to reduce or eliminate channel crosstalk contained in measurement points. The memory 222 may also store the generated transformed measurement points 230 that are used by the processor 224 to calculate various characteristics of the power distribution network. The calculated various characteristics may also be stored in the memory 222.

In some examples, the measurement circuitry 226 is connected to the power distribution network 206 and thus is able to sense and measure the value of the voltage and the current of the electrical signal at the meter 112. If the power distribution network 206 provides a three-phase power to premises at the geographical location of the meter 112, the measurement circuitry 226 can be connected to these three phases (i.e. phases A, B, and C) to measure their respective voltage value V and current value I.

In some implementations, the measured data is represented using measurement points 210. Each measurement point 210 is a complex vector of length six. The first three elements of the measurement point 210 represent the voltages $\tilde{V}_{m1}, \tilde{V}_{m2}, \tilde{V}_{m3}$ being measured by the meter 112 as analog waveforms on phases A, B, and C, respectively. The last three elements of the measurement point 210 represent the currents $\tilde{I}_{m1}, \tilde{I}_{m2}, \tilde{I}_{m3}$ being measured by the meter 112 as analog waveforms on phases A, B, and C, respectively. The measurement point 210 $\tilde{VI}_m$ can thus be represented using the vector form: $\tilde{VI}_m = <\tilde{V}_{m1}, \tilde{V}_{m2}, \tilde{V}_{m3}, \tilde{I}_{m1}, \tilde{I}_{m2}, \tilde{I}_{m3}>$. Each element of this vector is complex and includes a real component x and an imaginary component y. That is, each element has the following form:

$$w = x + iy = Me^{-i\theta} \quad (1)$$

where: $M = \sqrt{x^2+y^2}$ is the magnitude of the component, $$\theta = \tan^{-1}\frac{y}{x}$$

is the phase of the component, and $i = \sqrt{-1}$ is the imaginary unit.

For a measurement point $\tilde{VI}_m$, the real component of each element can be sensed or measured directly from the corresponding analog waveform. The imaginary component of each element can be produced algorithmically once the waveforms are digitized by A/D converters of the measurement circuitry 226. The complex notation is used here to conveniently represent both the magnitude and the phase.

The measurement points 210 obtained by the measurement circuitry 226 can be passed to the processor 224 for crosstalk cancelation to generate transformed measurement point 230. To perform the crosstalk cancelation, the processor 224 accesses a crosstalk cancelation function 228, for example, from the memory 222 of the metrology module 204, and applies the crosstalk cancelation function 228 to the measurement point 210.

In some examples, the crosstalk cancelation function 228 is a linear function and is represented using a crosstalk cancelation matrix $Z_T$. The crosstalk cancelation matrix $Z_T$ is a 6×6 complex matrix with elements being complex numbers. The crosstalk cancelation can thus be performed by applying the crosstalk cancelation matrix $Z_T$ to the measurement point $\tilde{VI}_m$, as follows:

$$\tilde{VI}_{ms} = \begin{bmatrix} \tilde{V}_{ms1} \\ \tilde{V}_{ms2} \\ \tilde{V}_{ms3} \\ \tilde{I}_{ms1} \\ \tilde{I}_{ms2} \\ \tilde{I}_{ms3} \end{bmatrix} = Z_T \tilde{VI}_m = \begin{bmatrix} Z_{T11} & Z_{T12} & Z_{T13} & Z_{T14} & Z_{T15} & Z_{T16} \\ Z_{T21} & Z_{T22} & Z_{T23} & Z_{T24} & Z_{T25} & Z_{T26} \\ Z_{T31} & Z_{T32} & Z_{T33} & Z_{T34} & Z_{T35} & Z_{T36} \\ Z_{T41} & Z_{T42} & Z_{T43} & Z_{T44} & Z_{T45} & Z_{T46} \\ Z_{T51} & Z_{T52} & Z_{T53} & Z_{T54} & Z_{T55} & Z_{T56} \\ Z_{T61} & Z_{T62} & Z_{T63} & Z_{T64} & Z_{T65} & Z_{T66} \end{bmatrix} \begin{bmatrix} \tilde{V}_{m1} \\ \tilde{V}_{m2} \\ \tilde{V}_{m3} \\ \tilde{I}_{m1} \\ \tilde{I}_{m2} \\ \tilde{I}_{m3} \end{bmatrix} = \quad (2)$$

$$\begin{bmatrix} Z_{T11}\tilde{V}_{m1} + Z_{T12}\tilde{V}_{m2} + Z_{T13}\tilde{V}_{m3} + Z_{T14}\tilde{I}_{m1} + Z_{T15}\tilde{I}_{m2} + Z_{T16}\tilde{I}_{m3} \\ Z_{T21}\tilde{V}_{m1} + Z_{T22}\tilde{V}_{m2} + Z_{T23}\tilde{V}_{m3} + Z_{T24}\tilde{I}_{m1} + Z_{T25}\tilde{I}_{m2} + Z_{T26}\tilde{I}_{m3} \\ Z_{T31}\tilde{V}_{m1} + Z_{T32}\tilde{V}_{m2} + Z_{T33}\tilde{V}_{m3} + Z_{T34}\tilde{I}_{m1} + Z_{T35}\tilde{I}_{m2} + Z_{T36}\tilde{I}_{m3} \\ Z_{T41}\tilde{V}_{m1} + Z_{T42}\tilde{V}_{m2} + Z_{T43}\tilde{V}_{m3} + Z_{T44}\tilde{I}_{m1} + Z_{T45}\tilde{I}_{m2} + Z_{T46}\tilde{I}_{m3} \\ Z_{T51}\tilde{V}_{m1} + Z_{T52}\tilde{V}_{m2} + Z_{T53}\tilde{V}_{m3} + Z_{T54}\tilde{I}_{m1} + Z_{T55}\tilde{I}_{m2} + Z_{T56}\tilde{I}_{m3} \\ Z_{T61}\tilde{V}_{m1} + Z_{T62}\tilde{V}_{m2} + Z_{T63}\tilde{V}_{m3} + Z_{T64}\tilde{I}_{m1} + Z_{T61}\tilde{I}_{m2} + Z_{T66}\tilde{I}_{m3} \end{bmatrix}.$$

Here, $\tilde{VI}_{ms}$ is the transformed measurement point 230, which is an estimate of the measurement point obtained from the power distribution network 206 without channel crosstalk. $\tilde{V}_{msi}$ is a voltage value of the transformed measurement point 230, and $\tilde{I}_{msi}$ is a current value of the transformed measurement point 230. $Z_{Tij}$ is the (i,j)-th element of the crosstalk cancelation matrix $Z_T$. Details about obtaining the crosstalk cancelation matrix $Z_T$ are provided below with respect to FIGS. 3 and 4.

The transformed measurement points 230 can be stored in the memory 222 of the metrology module 204. The processor 224 may further calculate the various characteristics of the power distribution network 206 at the geographical location of the meter 112 based on the transformed measurement points 230, such as the average or total power consumption within a certain period of time, the peak voltage, power surges, and load changes. The calculated characteristics of the power distribution network 206 can also be stored at the memory 222 and then sent to the communication module 202 for transmission to the headend system 104 in the meter measurement data 122.

The function of the communication module 202 includes receiving and sending messages, including the meter measurement data 122. The communication module 202 may include a communication device 212 such as an antenna and a radio. Alternatively, the communication device 212 may be any device that allows wireless or wired communication. The communication module 202 may also include a processor 213, and memory 214. The communication device 212 is used to receive and send messages through the network 140. The processor 213 controls functions performed by the communication module 202. The memory 214 may be utilized to store data used by the processor 213 to perform its function. For examples, the characteristics and other data in the meter measurement data 122 may be stored in the memory 214 of the communication module 204, in addition to or instead of in the memory 222 of the metrology module 202. The communication module 202 and the metrology module 204 communicate with each other through the local connection to provide data needed by the other module. Both the communication module 202 and the metrology module 204 may include computer-executable instructions stored in memory or in another type of computer-readable medium and one or more processors within the modules may execute the instructions to provide the functions described herein.

Figure 3:
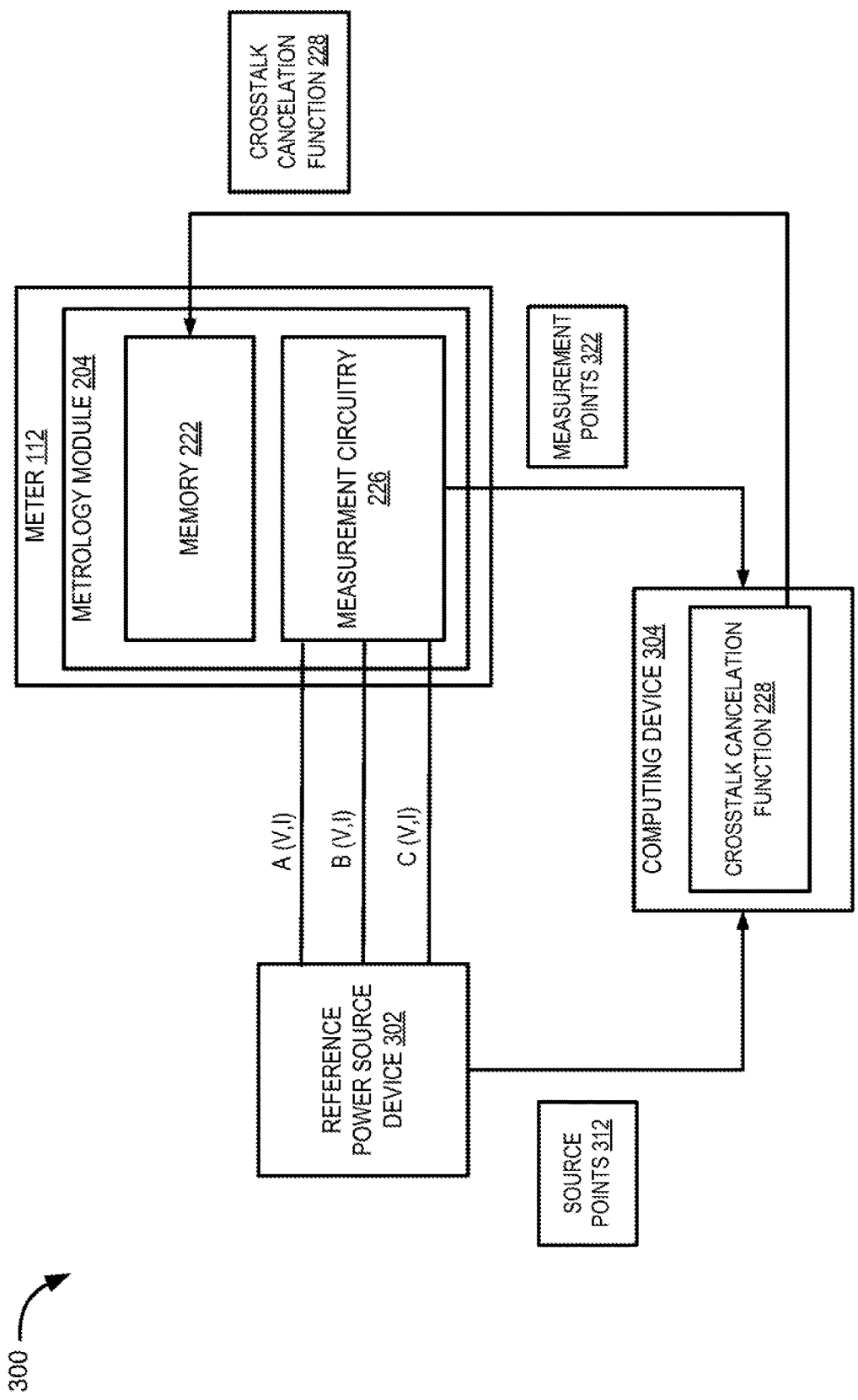
FIG. 3 is a block diagram depicting an example of a system for generating the crosstalk cancelation function for a meter, according to certain examples of the disclosure.

FIG. 3 is a block diagram depicting an example of a system 300 for generating the crosstalk cancelation function 228 for a meter 112, according to certain examples of the disclosure. The system 300 includes a reference power source device 302 connected to the measurement circuitry 226 of the meter 112. The reference power source device 302 is configured to provide a reference power source with recognized accuracy, stability, and reliability. For example, the reference power source device 302 can be a power source device that meets the energy reference standards such as RX-33 Xytronic Three Phase Energy Reference Standard devices. Examples of the reference power source device 302 include, but are not limited to, RS-933 Syntron Automated Calibration System from RADIAN RESEARCH Inc. of Lafayette Ind. and 6105A Electrical Power Calibration Standard from FLUKE CORPORATION of Everett Wash.

The reference power source device 302 can be configured to output accurate electrical signals according to settings that specify the magnitude and phase of the output voltage and current. As such, the electrical signal provided by the reference power source device 302 to the measurement circuitry 226 of the meter 112 can be used as the reference signals. The settings of the reference power source device 302 can be used as reference values of the voltage and current of the electrical signal. By comparing these reference values with the corresponding voltage and current values measured by the measurement circuitry 226, distortions, including the channel crosstalk, in the measured values can be determined. The crosstalk cancelation function 228 can thus be determined to reduce or remove such distortions.

In some examples, the reference power source device 302 is configured to provide electrical signals to the meter 112 according to the values specified in a set of source points 312. Similar to the measurement point 210, each of the source points 312 can be represented using a complex vector $\vec{VI}_s$ of length six. The first three elements of a source point 312 represent the voltages $V_{s1}$, $V_{s2}$, $V_{s3}$ of the reference electrical signal provided to the meter 112 as analog waveforms on the phases A, B, and C, respectively. The last three elements of the source point 312 represent the currents $I_{s1}$, $I_{s2}$, $I_{s3}$ of the reference electrical signal provided to the meter 112 as analog waveforms on the phases A, B, and C, respectively. The source point 312 $\vec{VI}_s$ can thus be represented as $\vec{VI}_s = <V_{s1}, V_{s2}, V_{s3}, I_{s1}, I_{s2}, I_{s3}>$. The set of source points 312 serve as the reference values of the electrical signal.

For each of the source points 312, the meter 112 generates a corresponding measurement point 322 by measuring the voltage and current values of the reference electrical signal at the meter 112. Similarly, the measurement point 322 is represented using a complex vector $\vec{VI}_m = <V_{m1}, V_{m2}, V_{m3}, I_{m1}, I_{m2}, I_{m3}>$. Here, $V_{m1}$, $V_{m2}$, $V_{m3}$ represent the voltages of the reference electrical signal measured by the meter 112 on the phases A, B, and C, respectively; $I_{m1}$, $I_{m2}$, $I_{m3}$ represent the currents of the reference electrical signal measured by the meter 112 on phases A, B, and C, respectively. Each element of the $\vec{VI}_s$ and $\vec{VI}_m$ is a complex number having the form shown in Eqn. (1).

In some examples, the channel crosstalk for the meter 112 is modeled as a linear transformation that maps a source point $\vec{VI}_s$ to its corresponding measurement point 322 $\vec{VI}_m$. Mathematically, this linear transformation can be represented as $$\vec{VI}_m = \begin{bmatrix} V_{m1} \\ V_{m2} \\ V_{m3} \\ I_{m1} \\ I_{m2} \\ I_{m3} \end{bmatrix} = Z_T \vec{VI}_s = \begin{bmatrix} X_{T11} & X_{T12} & X_{T13} & X_{T14} & X_{T15} & X_{T16} \\ X_{T21} & X_{T22} & X_{T23} & X_{T24} & X_{T25} & X_{T26} \\ X_{T31} & X_{T32} & X_{T33} & X_{T34} & X_{T35} & X_{T36} \\ X_{T41} & X_{T42} & X_{T43} & X_{T44} & X_{T45} & X_{T46} \\ X_{T51} & X_{T52} & X_{T53} & X_{T54} & X_{T55} & X_{T56} \\ X_{T61} & X_{T62} & X_{T63} & X_{T64} & X_{T65} & X_{T66} \end{bmatrix} \begin{bmatrix} V_{s1} \\ V_{s2} \\ V_{s3} \\ I_{s1} \\ I_{s2} \\ I_{s3} \end{bmatrix} = \quad (3)$$

$$\begin{bmatrix} X_{T11}V_{s1} + X_{T12}V_{s2} + X_{T13}V_{s3} + X_{T14}I_{s1} + X_{T15}I_{s2} + X_{T16}I_{s3} \\ X_{T21}V_{s1} + X_{T22}V_{s2} + X_{T23}V_{s3} + X_{T24}I_{s1} + X_{T25}I_{s2} + X_{T26}I_{s3} \\ X_{T31}V_{s1} + X_{T32}V_{s2} + X_{T33}V_{s3} + X_{T34}I_{s1} + X_{T35}I_{s2} + X_{T36}I_{s3} \\ X_{T41}V_{s1} + X_{T42}V_{s2} + X_{T43}V_{s3} + X_{T44}I_{s1} + X_{T45}I_{s2} + X_{T46}I_{s3} \\ X_{T51}V_{s1} + X_{T52}V_{s2} + X_{T53}V_{s3} + X_{T54}I_{s1} + X_{T55}I_{s2} + X_{T56}I_{s3} \\ X_{T61}V_{s1} + X_{T62}V_{s2} + X_{T63}V_{s3} + X_{T64}I_{s1} + X_{T61}I_{s2} + X_{T66}I_{s3} \end{bmatrix}.$$

Here, $X_{Tij}$ is the (i,j)-th element of the crosstalk transformation matrix $X_T$. Under this model, each component of the matrix $X_T$ imposes a magnitude and phase distortion on each component of $\vec{VI}_s$ which sum together and form a component of $\vec{VI}_m$. As such, each component of $\vec{VI}_m$ is a function of the components of $\vec{VI}_s$. As discussed above, $\vec{VI}_s$ can be selected and thus is known. $\vec{VI}_m$ is measured by the meter 112 and is also known. The crosstalk transformation matrix $X_T$ can thus be derived or approximated based on $\overline{Vi}_s$ and $\overline{Vi}_m$. The inverse of the crosstalk transformation matrix $X_T$ becomes the crosstalk cancelation matrix $Z_T$.

In order to derive a form of the $X_T$ matrix and its inverse matrix $Z_T$, a proper set of source points 312 and measurement points 322 can be selected. As discussed above, the source point $\overline{Vi}_s$ was introduced to represent the array of voltage and current waveforms being provided by the reference power source device 302. The six complex elements of $\overline{Vi}_s$ are continually changing with time. Assuming pure sinusoidal sourcing, $\overline{Vi}_s$ can be characterized by its parameterization $\widetilde{Vi}_s$ which include the root-mean-square (RMS) voltages and currents, along with the phase associated with each of these elements. $\widetilde{Vi}_s$ is still a complex vector but it is no longer changing with time.

An example of $\widetilde{Vi}_s$ can be $\widetilde{Vi}_s = <\hat{V}_{s1}, \hat{V}_{s2}, \hat{V}_{s3}, \hat{I}_{s1}, \hat{I}_{s2}, \hat{I}_{s3}> = <$(120V,0°), (120V,120°), (120V,−120°), (1 A,0°), (1 A,120°), (1 A,−120°)>. This source point represents a balanced Y configuration power source that has the following properties:
1) 120 Volts on each of the three phases A, B, and C;
2) 1 Amp on each of the three phases A, B, and C;
3) Unity power factor;
4) 120 degrees between phases A and B; and
5) −120 degrees between phases A and C.

This example source point $\widetilde{Vi}_s$ can also be represented by $\widetilde{Vi}_{s1}$=120
$\widetilde{Vi}_{s2}$=−60+i103.923
$\widetilde{Vi}_{s3}$=−60−i103.923
$\tilde{I}_{s1}$=1
$\tilde{I}_{s2}$=−0.5+i0.866
$\tilde{I}_{s2}$=−0.5−i0.866

The meter 112 measuring the electrical signal provided by the reference power source device 302 for the source point $\widetilde{Vi}_s$ will produce the measurement point $\widetilde{Vi}_m = X_T \widetilde{Vi}_s$.

The selection of the set of parameterized source points 312 ($\widetilde{Vi}_s$), in order to collect the corresponding set of measurement points 322 ($\widetilde{Vi}_s$), depends upon how magnitude and phase affects the transform ($\overline{Vi}_m = X_T \overline{Vi}_s$). For single tap voltage and current sensors, a fixed RMS voltage and current for every source point can be used. In one example, the RMS voltages of the source points 312 are fixed at 120V and the RMS currents are fixed at 1 Amp. The phases are varied to generate N parameterized source points 312.

In some implementations, N is selected to be 32. The 32 parameterized source points are generated by varying the phases of the voltages and currents. Corresponding 32 measurement points are collected to compute the crosstalk transformation matrix $X_T$. Table 1 shows an example of the phases of the 32 parameterized source points. In Table 1, the phase of the voltage on A is used as a reference phase and other phases are represented with respect to this reference phase. For example, for source point 1, the phase of the voltage on A is denoted as 0°. The phases of the voltages on B and C are both −120°. The phases of the currents on A, B, and C are all −60°.

TABLE 1

| | Phases of voltages and currents of the parameterized source points | | | | | |
|---|---|---|---|---|---|---|
| Source Point | Voltage-A Phase Ref | Voltage-B Phase | Voltage-C Phase | Current-A to Voltage-A Phase | Current-B to Voltage-B Phase | Current-C to Voltage-C Phase |
| 1 | 0 | −120.0000 | −120.0000 | −60.0000 | −60.0000 | −60.0000 |
| 2 | 0 | −120.0000 | 120.0000 | −60.0000 | −60.0000 | −60.0000 |
| 3 | 0 | 120.0000 | −120.0000 | −60.0000 | −60.0000 | −60.0000 |
| 4 | 0 | 120.0000 | 120.0000 | −60.0000 | −60.0000 | −60.0000 |
| 5 | 0 | −120.0000 | −120.0000 | −60.0000 | −60.0000 | 60.0000 |
| 6 | 0 | −120.0000 | 120.0000 | −60.0000 | −60.0000 | 60.0000 |
| 7 | 0 | 120.0000 | −120.0000 | −60.0000 | −60.0000 | 60.0000 |
| 8 | 0 | 120.0000 | 120.0000 | −60.0000 | −60.0000 | 60.0000 |
| 9 | 0 | −120.0000 | −120.0000 | −60.0000 | 60.0000 | −60.0000 |
| 10 | 0 | −120.0000 | 120.0000 | −60.0000 | 60.0000 | −60.0000 |
| 11 | 0 | 120.0000 | −120.0000 | −60.0000 | 60.0000 | −60.0000 |
| 12 | 0 | 120.0000 | 120.0000 | −60.0000 | 60.0000 | −60.0000 |
| 13 | 0 | −120.0000 | −120.0000 | −60.0000 | 60.0000 | 60.0000 |
| 14 | 0 | −120.0000 | 120.0000 | −60.0000 | 60.0000 | 60.0000 |
| 15 | 0 | 120.0000 | −120.0000 | −60.0000 | 60.0000 | 60.0000 |
| 16 | 0 | 120.0000 | 120.0000 | −60.0000 | 60.0000 | 60.0000 |
| 17 | 0 | −120.0000 | −120.0000 | 60.0000 | −60.0000 | −60.0000 |
| 18 | 0 | −120.0000 | 120.0000 | 60.0000 | −60.0000 | −60.0000 |
| 19 | 0 | 120.0000 | −120.0000 | 60.0000 | −60.0000 | −60.0000 |
| 20 | 0 | 120.0000 | 120.0000 | 60.0000 | −60.0000 | −60.0000 |
| 21 | 0 | −120.0000 | −120.0000 | 60.0000 | −60.0000 | 60.0000 |
| 22 | 0 | −120.0000 | 120.0000 | 60.0000 | −60.0000 | 60.0000 |
| 23 | 0 | 120.0000 | −120.0000 | 60.0000 | −60.0000 | 60.0000 |
| 24 | 0 | 120.0000 | 120.0000 | 60.0000 | −60.0000 | 60.0000 |
| 25 | 0 | −120.0000 | −120.0000 | 60.0000 | 60.0000 | −60.0000 |
| 26 | 0 | −120.0000 | 120.0000 | 60.0000 | 60.0000 | −60.0000 |
| 27 | 0 | 120.0000 | −120.0000 | 60.0000 | 60.0000 | −60.0000 |
| 28 | 0 | 120.0000 | 120.0000 | 60.0000 | 60.0000 | −60.0000 |
| 29 | 0 | −120.0000 | −120.0000 | 60.0000 | 60.0000 | 60.0000 |
| 30 | 0 | −120.0000 | 120.0000 | 60.0000 | 60.0000 | 60.0000 |
| 31 | 0 | 120.0000 | −120.0000 | 60.0000 | 60.0000 | 60.0000 |
| 32 | 0 | 120.0000 | 120.0000 | 60.0000 | 60.0000 | 60.0000 |

The set of the N parameterized source points collectively represents a 6×N matrix $\vec{Vl}_{s[N]}$, where each column represents a source point vector $\vec{Vl}$. The corresponding set of measurement points represents another 6×N matrix $\vec{Vl}_{m[N]}$ where each column represents the corresponding measurement point vector $\vec{Vl}$. To derive the crosstalk cancelation matrix $Z_T$, a computing device 304 is employed. The computing device may be a personal computer ("PC"), a desktop workstation, a laptop, a smartphone, a server computer, or any other computing device capable of performing the computation of crosstalk cancelation matrix $Z_T$ described below.

The computing device 304 first derives the inverse of the matrix $\vec{Vl}_{m[N]}$. Since N can be a number other than 6, the matrix $\vec{Vl}_{m[N]}$ may not be a square matrix. In those cases, the pseudoinverse of the matrix $\vec{Vl}_{m[N]}$ is calculated. The pseudoinverse of a matrix "D" produces a matrix "H" having the same dimensions as the transpose of "D" so that DHD=D, HDH=H, and DH and HD are Hermitian. In some examples, singular value decomposition (SVD) of the matrix D can be utilized to derive the pseudoinverse of the matrix D.

Denote the pseudoinverse of $\vec{Vl}_{m[N]}$ as $\vec{Vl}_{m[N]}^{-1}=\text{pinv}(\vec{Vl}_{m[N]})$, which is an N×6 matrix. The computing device 304 derives the crosstalk cancelation matrix $Z_T$ as the inverse of the crosstalk transformation matrix $X_T$ which can be computed as $Z_T=X_T^{-1}=\vec{Vl}_{s[N]}\vec{Vl}_{m[N]}^{-1}$. In this example, the crosstalk cancelation matrix $Z_T$ is used as the crosstalk cancelation function 228 and then sent to the meter 112. As discussed above, the meter 112 stores the crosstalk cancelation matrix $Z_T$ in its memory 222 and uses $Z_T$ according to Eqn. (2) as described above with respect to FIG. 2 to perform crosstalk cancelation.

It should be understood that although the above description focuses on a single tap voltage and current meter, the crosstalk cancelation matrix can be derived similarly for other types of meters. For example, some meters might contain multiple taps for voltage (e.g. 120V, 240V and 480V) and multiple taps for current (e.g. 1 A, 10 A, 20 A, and 50 A). For these meters, the above process can be applied for each tap (i.e. using the same or similar phase variation table as the 120V and 1 A single tap case described above) to derive the crosstalk cancelation matrix.

It should be further understood that while the above description focuses on a linear crosstalk cancelation function 228 represented by a crosstalk cancelation matrix $Z_T$, other types of linear functions or non-linear functions can also be utilized to generate the crosstalk cancelation function 228. The crosstalk cancelation function 228 may be stored at the meter 112 and applied to the measurement points 210 during the measurement of electrical signal provided by the power distribution network 206.

Figure 4:
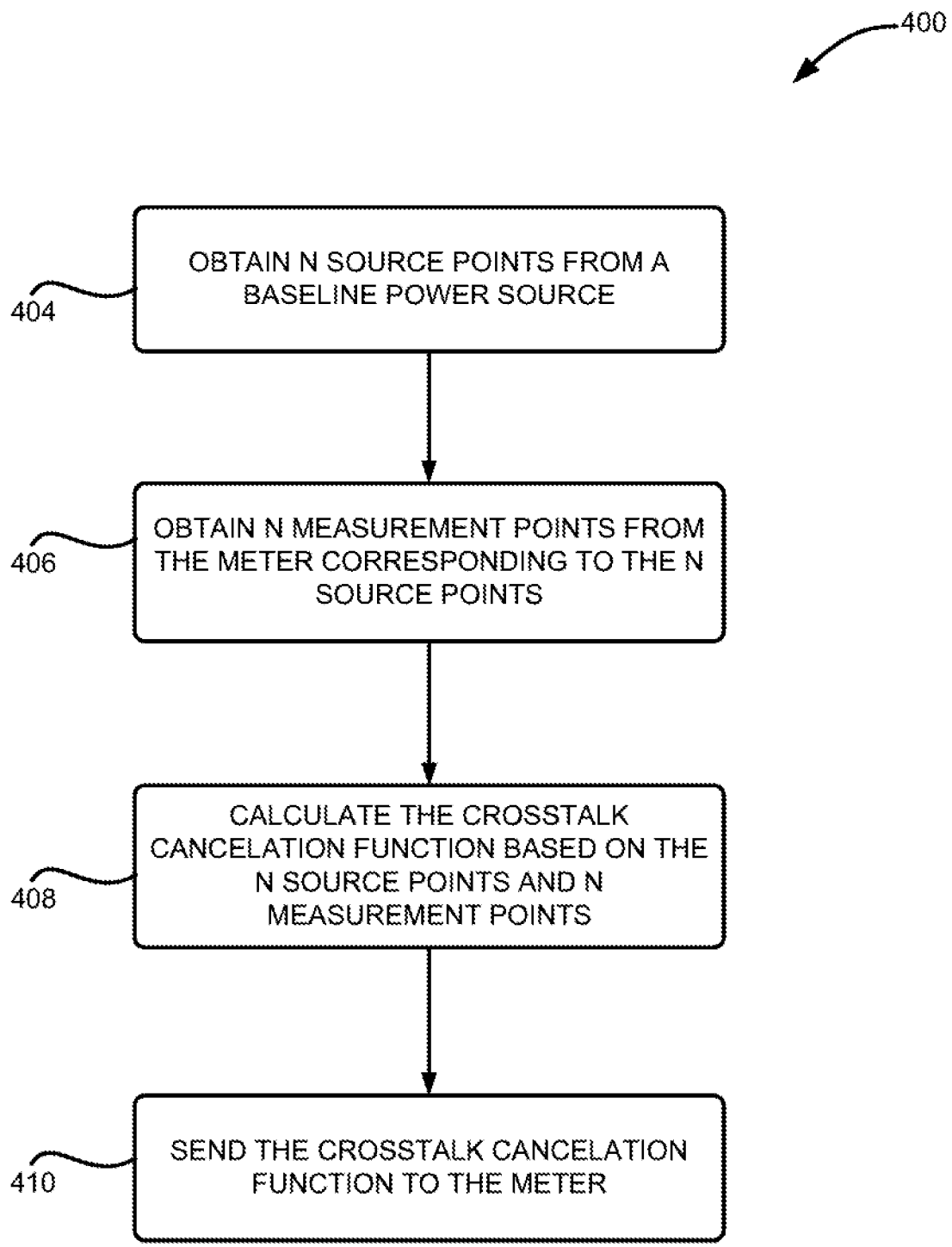
FIG. 4 shows an example of a process for generating the crosstalk cancelation function for a meter, according to certain examples of the disclosure.

FIG. 4 shows an example of a process 400 for generating the crosstalk cancelation function 228 for a meter 112, according to certain examples of the disclosure. One or more devices (e.g., the computing device 304) implement some operations depicted in FIG. 4 by executing suitable program code. For illustrative purposes, process 400 is described with reference to certain examples depicted in the figures. Other implementations, however, are possible. In some examples, process 400 is performed during the calibration process of the meter 112.

At block 404, the process 400 involves the computing device 304 obtaining a set of source points 312 which can be represented by their respective parameterization $\vec{Vl}_s$. In some examples, the number of source point 312 obtained is at least 32. The set of source points 312 forms the 6×N matrix $\vec{Vl}_{s[N]}$. At block 406, the process 400 involves the computing device 304 obtaining a set of measurement points 322 that correspond to the set of source points 312 from the meter 112. The measurement points 322 are generated by the measurement circuitry 226 of the meter 112 and form the 6×N matrix $\vec{Vl}_{m[N]}$.

At block 408, the process 400 involves calculating the crosstalk cancelation function 228 based on the set of source points 312 and the corresponding set of measurement points 322. In some examples, the channel crosstalk for the meter 112 is modeled as a linear transformation that maps a source point $\vec{Vl}_s$ to its corresponding measurement point $\vec{Vl}_m$, e.g. $\vec{Vl}_m=X_T\vec{Vl}_s$. In these examples, the crosstalk cancelation function 228 can be calculated as a linear function represented by a 6×6 crosstalk cancelation matrix $Z_T$. As discussed above in detail with regard to FIG. 3, the crosstalk cancelation matrix $Z_T$ can be calculated as the inverse of the crosstalk transformation matrix $X_T$ which can be computed as $Z_T=X_T^{-1}=\vec{Vl}_{s[N]}\vec{Vl}_{m[N]}^{-1}$. Other types of crosstalk cancelation functions 228 can also be generated. At block 410, the computing device 304 sends the generated crosstalk cancelation function 228 to the meter 112 for use during the measurement of the power distribution network 206.

Figure 5:
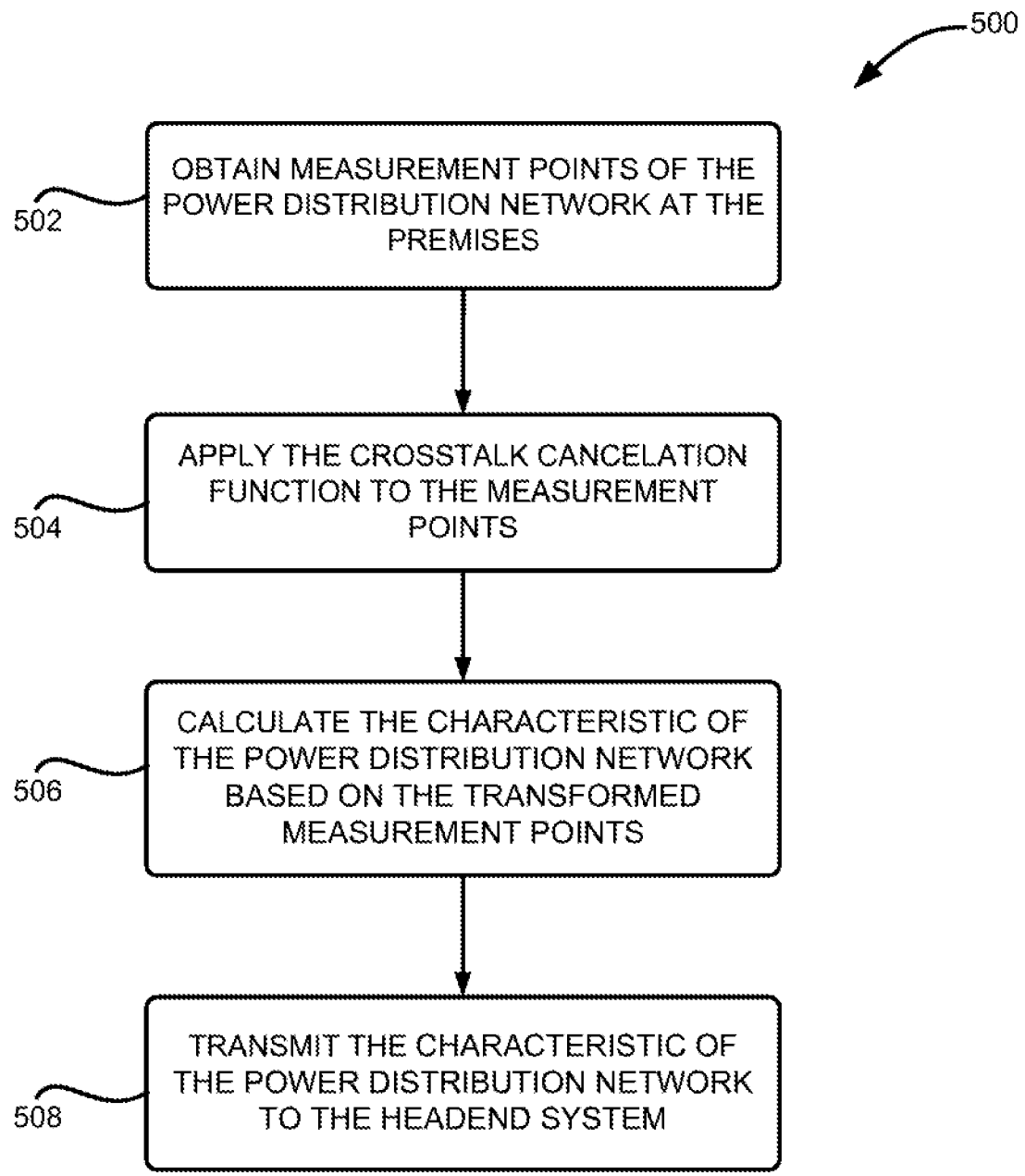
FIG. 5 shows an example of a process for performing crosstalk cancelation at a meter, according to certain examples of the disclosure.

FIG. 5 shows an example of a process 500 for performing crosstalk cancelation at a meter 112, according to certain examples of the disclosure. One or more devices (e.g., the metrology module 204) implement operations depicted in FIG. 5 by executing suitable program code. For illustrative purposes, process 500 is described with reference to certain examples depicted in the figures. Other implementations, however, are possible.

The process 500 begins at block 502 where the meter 112 obtains measurement points 210 by measuring the electrical signals of the power distribution network 206. Each measurement point 210 can be represented by a complex vector $\vec{Vl}_m$. At block 504, the meter 112 applies the crosstalk cancelation function 228 to the measurement points 210. In some examples, the crosstalk cancelation function 228 is represented by a crosstalk cancelation matrix $Z_T$. As discussed above in detail with respect to FIG. 2, applying the crosstalk cancelation function 228 can include multiplying the crosstalk cancelation matrix $Z_T$ with the complex vector $\vec{Vl}_m$ of the respective measurement point 210 as shown in Eqn. (2). The output of the crosstalk cancelation function 228 is the transformed measurement points 230, $\vec{Vl}_{ms}$. The transformed measurement points 230 may be generated as each measurement point 210 becomes available. Alternatively, or additionally, the transformed measurement points 230 are generated in batches, e.g. when there are at least K measurement points 210 available. K can be any integer number greater than 1.

At block 506, the meter 112 calculates the various characteristics of the power distribution network 206 based on the transformed measurement points 230. As discussed above in detail with respect to FIG. 2, the characteristics of the power distribution network 206 may include the average or total power consumption, peak voltages, power surges, load changes and so on. At block 508, the meter 112 transmits the calculated characteristics along with other data as the meter measurement data 122 to the headend system 104 through the mesh network 140.

It should be understood that while the above description focuses on a three-phase power supply, the crosstalk cancelation can be applied to two-phase power supply as well. In the case of the two-phase power supply, each of the source points $\vec{Vl}_s$, or $\widehat{Vl}_s$ and measurement points $\vec{Vl}_m$, $\vec{Vl}_m$, $\vec{Vl}_m$, or $\vec{Vl}_{ms}$ are reduced to a 4-element vector. Each of the crosstalk transformation matrix $X_T$ and crosstalk cancelation matrix $Z_T$ become a 4×4 matrix. The above procedure can be applied similarly to derive the crosstalk cancelation matrix $Z_T$ based on the source points and measurement points. The transformed measurement points can be obtained by applying the crosstalk cancelation function to the measurement points obtained by the meter during the measurement.

Example of a Computing System for Implementing Certain Embodiments

Figure 6:
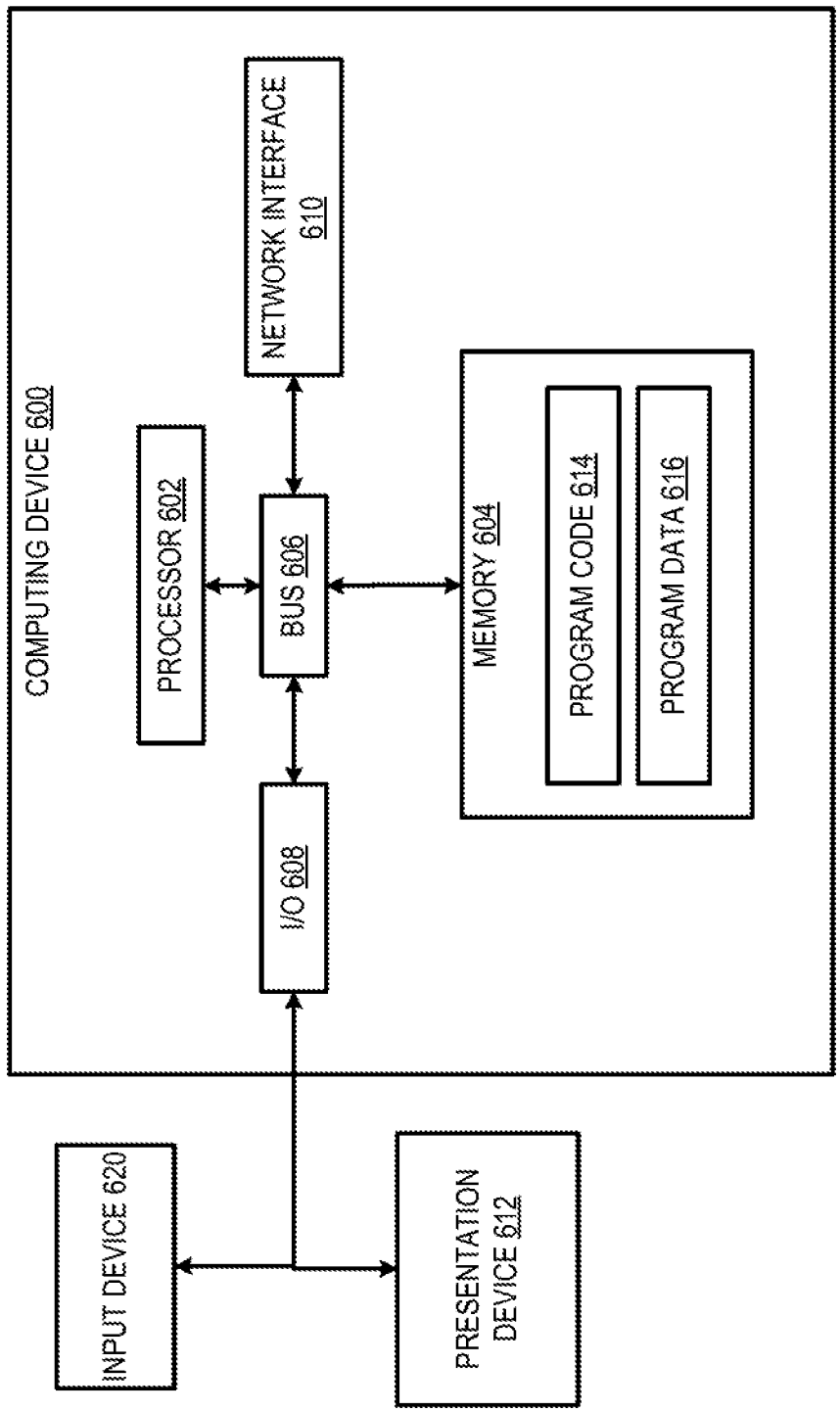
FIG. 6 is a block diagram depicting an example of a computing device suitable for implementing aspects of the techniques and technologies presented herein.

Any suitable computing system or group of computing systems can be used for performing the operations described herein. For example, FIG. 6 depicts an example of the computing system 600. The implementation of computing system 600 could be used for the computing device 304.

The depicted example of a computing system 600 includes a processor 602 communicatively coupled to one or more memory devices 604. The processor 602 executes computer-executable program code stored in a memory device 604, accesses information stored in the memory device 604, or both. Examples of the processor 602 include a microprocessor, an application-specific integrated circuit ("ASIC"), a field-programmable gate array ("FPGA"), or any other suitable processing device. The processor 602 can include any number of processing devices, including a single processing device.

A memory device 604 includes any suitable non-transitory computer-readable medium for storing program code 614 (e.g. the code used for deriving the crosstalk cancelation function 228), program data 616 (e.g. the generated crosstalk cancelation function 228), or both. A computer-readable medium can include any electronic, optical, magnetic, or other storage device capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device can read instructions. The instructions may include processor-specific instructions generated by a compiler or an interpreter from code written in any suitable computer-programming language, including, for example, C, C++, C#, Visual Basic, Java, Python, Perl, JavaScript, and ActionScript.

The computing system 600 executes program code 614 that configures the processor 602 to perform one or more of the operations described herein. Examples of the program code 614 include, in various embodiments, the program code used to generate the crosstalk cancelation function 228, such as the crosstalk cancelation matrix $Z_T$, or other suitable applications that perform one or more operations described herein. The program code may be resident in the memory device 604 or any suitable computer-readable medium and may be executed by the processor 602 or any other suitable processor.

In some embodiments, one or more memory devices 604 stores program data 616 that includes one or more datasets described herein. Examples of these datasets include the source points 312, the measurement points 322, the crosstalk cancelation function 228, etc. In some embodiments, one or more of data sets, models, and functions are stored in the same memory device (e.g., one of the memory devices 604). In additional or alternative embodiments, one or more of the programs, data sets, models, and functions described herein are stored in different memory devices 604 accessible via a data network. One or more buses 606 are also included in the computing system 600. The buses 606 communicatively couples one or more components of a respective one of the computing system 600.

In some embodiments, the computing system 600 also includes a network interface device 610. The network interface device 610 includes any device or group of devices suitable for establishing a wired or wireless data connection to one or more data networks. Non-limiting examples of the network interface device 610 include an Ethernet network adapter, a modem, and/or the like. The computing system 600 is able to communicate with one or more other computing devices (e.g., the headend system 104) via a data network using the network interface device 610.

The computing system 600 may also include a number of external or internal devices, such as an input device 620, a presentation device 1618, or other input or output devices. For example, the computing system 600 is shown with one or more input/output ("I/O") interfaces 608. An I/O interface 608 can receive input from input devices or provide output to output devices. An input device 620 can include any device or group of devices suitable for receiving visual, auditory, or other suitable input that controls or affects the operations of the processor 602. Non-limiting examples of the input device 620 include a touchscreen, a mouse, a keyboard, a microphone, a separate mobile computing device, etc. A presentation device 618 can include any device or group of devices suitable for providing visual, auditory, or other suitable sensory output. Non-limiting examples of the presentation device 618 include a touchscreen, a monitor, a speaker, a separate mobile computing device, etc.

Although FIG. 6 depicts the input device 620 and the presentation device 618 as being local to the computing device, other implementations are possible. For instance, in some embodiments, one or more of the input device 620 and the presentation device 618 can include a remote client-computing device that communicates with the computing system 600 via the network interface device 610 using one or more data networks.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as an open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A device connected to a power distribution network, comprising:
   a measurement circuitry configured to measure a voltage and a current on at least one phase of the power distribution network;
   a processor configured to execute computer-readable instructions;
   a memory configured to store a crosstalk cancelation function that reduces crosstalk effects of the measurement circuitry and the computer-readable instructions that, when executed by the processor, cause the processor to perform operations comprising:
      obtaining a measurement point from the measurement circuitry, the measurement point comprising at least a voltage value and a current value, each of the voltage value and the current value comprising a magnitude and a phase;
      transforming the measurement point to obtain a transformed measurement point by applying the crosstalk cancelation function to the measurement point, wherein the crosstalk cancelation function is configured to adjust both the magnitude and the phase of the voltage value and both the magnitude and the phase of the current value;
      determining at least a characteristic of the power distribution network based on at least the transformed measurement point; and
      causing the characteristic of the power distribution network to be transmitted to a remote device.

2. The device of claim 1, wherein the power distribution network has three phases, and wherein the measurement point comprises a voltage value and a current value for each of the three phases.

3. The device of claim 2, wherein each of the voltage value and the current value for each of the three phases is determined by the magnitude and the phase of the respective value.

4. The device of claim 1, wherein the crosstalk cancelation function comprises a crosstalk cancelation matrix $Z_T$, and wherein applying the crosstalk cancelation function to the measurement point is performed by:

$$\tilde{VI}_{ms} = \begin{bmatrix} \tilde{V}_{ms1} \\ \tilde{V}_{ms2} \\ \tilde{V}_{ms3} \\ \tilde{I}_{ms1} \\ \tilde{I}_{ms2} \\ \tilde{I}_{ms3} \end{bmatrix} = Z_T \tilde{VI}_m = Z_T \begin{bmatrix} \tilde{V}_{m1} \\ \tilde{V}_{m2} \\ \tilde{V}_{m3} \\ \tilde{I}_{m1} \\ \tilde{I}_{m2} \\ \tilde{I}_{m3} \end{bmatrix} = \begin{bmatrix} Z_{T11}\tilde{V}_{m1} + Z_{T12}\tilde{V}_{m2} + Z_{T13}\tilde{V}_{m3} + Z_{T14}\tilde{I}_{m1} + Z_{T15}\tilde{I}_{m2} + Z_{T16}\tilde{I}_{m3} \\ Z_{T21}\tilde{V}_{m1} + Z_{T22}\tilde{V}_{m2} + Z_{T23}\tilde{V}_{m3} + Z_{T24}\tilde{I}_{m1} + Z_{T25}\tilde{I}_{m2} + Z_{T26}\tilde{I}_{m3} \\ Z_{T31}\tilde{V}_{m1} + Z_{T32}\tilde{V}_{m2} + Z_{T33}\tilde{V}_{m3} + Z_{T34}\tilde{I}_{m1} + Z_{T35}\tilde{I}_{m2} + Z_{T36}\tilde{I}_{m3} \\ Z_{T41}\tilde{V}_{m1} + Z_{T42}\tilde{V}_{m2} + Z_{T43}\tilde{V}_{m3} + Z_{T44}\tilde{I}_{m1} + Z_{T45}\tilde{I}_{m2} + Z_{T46}\tilde{I}_{m3} \\ Z_{T51}\tilde{V}_{m1} + Z_{T52}\tilde{V}_{m2} + Z_{T53}\tilde{V}_{m3} + Z_{T54}\tilde{I}_{m1} + Z_{T55}\tilde{I}_{m2} + Z_{T56}\tilde{I}_{m3} \\ Z_{T61}\tilde{V}_{m1} + Z_{T62}\tilde{V}_{m2} + Z_{T63}\tilde{V}_{m3} + Z_{T64}\tilde{I}_{m1} + Z_{T61}\tilde{I}_{m2} + Z_{T66}\tilde{I}_{m3} \end{bmatrix},$$

wherein
   $\tilde{VI}_m$ is the measurement point, $\tilde{V}_{mi}$ is the voltage value of the measurement point, and $\tilde{I}_{mi}$ is the current value of the measurement point;
   $\tilde{VI}_{ms}$ is the transformed measurement point, $\tilde{V}_{msi}$ is a voltage value of the transformed measurement point, and $\tilde{I}_{msi}$ is a current value of the transformed measurement point; and
   $Z_{Tij}$ is an (i,j)-th element of the crosstalk cancelation matrix $Z_T$.

5. The device of claim 1, wherein the crosstalk cancelation function is determined based on a plurality of source points and a plurality of measurement points corresponding to the plurality of source points.

6. The device of claim 5, wherein the crosstalk cancelation function is determined as a crosstalk cancelation matrix that transforms the plurality of measurement points to the plurality of source points.

7. The device of claim 5, wherein each of the plurality of source points comprises a particular combination of a voltage value and a current value, wherein the voltage values of the plurality of source points have a same root-mean-square (RMS) magnitude and multiple phases, and wherein current values of the plurality of source points have a same RMS magnitude and multiple phases.

8. The device of claim 5, wherein the plurality of source points are provided by a reference power source device that is independent of the power distribution network.

9. The device of claim 1, wherein the characteristic of the power distribution network comprises one of an average power consumption, a total power consumption, a power surge, or a load change.

10. A method for reducing crosstalk in measurement data of a power distribution network, the method comprising:
  obtaining, by a meter connected to a power distribution network, a measurement point comprising at least a voltage value and a current value on at least one phase of the power distribution network, wherein each of the voltage value and the current value is determined by a magnitude and a phase of the respective value;
  transforming, by the meter, the measurement point to obtain a transformed measurement point by applying a crosstalk cancelation function to the measurement point, wherein the crosstalk cancelation function reduces crosstalk effects of the meter and is configured to adjust both the magnitude and the phase of the voltage value and both the magnitude and the phase of the current value;
  determining, by the meter, at least one characteristic of the power distribution network based on at least the transformed measurement point; and
  causing, by the meter, the at least one characteristic of the power distribution network to be transmitted to a remote device.

11. The method of claim 10, wherein the crosstalk cancelation function comprises a crosstalk cancelation matrix $Z_T$, and wherein applying the crosstalk cancelation function to the measurement point is performed by:

$$\tilde{VI}_{ms} = \begin{bmatrix} \tilde{V}_{ms1} \\ \tilde{V}_{ms2} \\ \tilde{V}_{ms3} \\ \tilde{I}_{ms1} \\ \tilde{I}_{ms2} \\ \tilde{I}_{ms3} \end{bmatrix} =$$

$$Z_T \tilde{VI}_m = Z_T \begin{bmatrix} \tilde{V}_{m1} \\ \tilde{V}_{m2} \\ \tilde{V}_{m3} \\ \tilde{I}_{m1} \\ \tilde{I}_{m2} \\ \tilde{I}_{m3} \end{bmatrix} = \begin{bmatrix} Z_{T11}\tilde{V}_{m1} + & Z_{T12}\tilde{V}_{m2} + Z_{T13}\tilde{V}_{m3} + Z_{T14}\tilde{I}_{m1} + Z_{T15}\tilde{I}_{m2} + Z_{T16}\tilde{I}_{m3} \\ Z_{T21}\tilde{V}_{m1} + & Z_{T22}\tilde{V}_{m2} + Z_{T23}\tilde{V}_{m3} + Z_{T24}\tilde{I}_{m1} + Z_{T25}\tilde{I}_{m2} + Z_{T26}\tilde{I}_{m3} \\ Z_{T31}\tilde{V}_{m1} + & Z_{T32}\tilde{V}_{m2} + Z_{T33}\tilde{V}_{m3} + Z_{T34}\tilde{I}_{m1} + Z_{T35}\tilde{I}_{m2} + Z_{T36}\tilde{I}_{m3} \\ Z_{T41}\tilde{V}_{m1} + & Z_{T42}\tilde{V}_{m2} + Z_{T43}\tilde{V}_{m3} + Z_{T44}\tilde{I}_{m1} + Z_{T45}\tilde{I}_{m2} + Z_{T46}\tilde{I}_{m3} \\ Z_{T51}\tilde{V}_{m1} + & Z_{T52}\tilde{V}_{m2} + Z_{T53}\tilde{V}_{m3} + Z_{T54}\tilde{I}_{m1} + Z_{T55}\tilde{I}_{m2} + Z_{T56}\tilde{I}_{m3} \\ Z_{T61}\tilde{V}_{m1} + & Z_{T62}\tilde{V}_{m2} + Z_{T63}\tilde{V}_{m3} + Z_{T64}\tilde{I}_{m1} + Z_{T61}\tilde{I}_{m2} + Z_{T66}\tilde{I}_{m3} \end{bmatrix},$$

wherein $\tilde{VI}_m$ is the measurement point, $\tilde{V}_{mi}$ is the voltage value of the measurement point, and $\tilde{I}_{mi}$ is the current value of the measurement point;

$\tilde{VI}_{ms}$ is the transformed measurement point, $\tilde{V}_{msi}$ is a voltage value of the transformed measurement point, and $\tilde{I}_{msi}$ is a current value of the transformed measurement point; and $Z_{Tij}$ is an (i,j)-th element of the crosstalk cancelation matrix $Z_T$.

12. The method of claim 10, wherein the crosstalk cancelation function is determined based on a plurality of source points and a plurality of measurement points corresponding to the plurality of source points.

13. The method of claim 12, wherein the crosstalk cancelation function is determined as a crosstalk cancelation matrix that transforms the plurality of measurement points to the plurality of source points.

14. The method of claim 12, wherein the plurality of source points are provided by a reference power source device that is independent of the power distribution network.

15. The method of claim 12, wherein each of the plurality of source points comprises a particular combination of a voltage value and a current value, wherein the voltage values of the plurality of source points have a same root-mean-square (RMS) magnitude and multiple phases, and wherein the current values of the plurality of source points have a same RMS magnitude and multiple phases.

16. A meter of a power distribution network, comprising:
  a metrology module configured for:
    obtaining a measurement point for a power distribution network, the measurement point comprising at least a voltage value and a current value on at least one phase of the power distribution network;
    transforming the measurement point by applying a crosstalk cancelation function to the measurement point to obtain a transformed measurement point, wherein the crosstalk cancelation function reduces crosstalk effects of the metrology module and is configured to adjust both a magnitude and a phase of the voltage value and both a magnitude and a phase of the current value; and
    determining at least one characteristic of the power distribution network based on at least the transformed measurement point; and
  a communication module configured for:
    transmitting the at least one characteristic of the power distribution network to a remote device via a mesh network.

17. The meter of claim 16, wherein the crosstalk cancelation function comprises a crosstalk cancelation matrix $Z_T$, and wherein applying the crosstalk cancelation function to the measurement point is performed by:

$$\tilde{VI}_{ms} = \begin{bmatrix} \tilde{V}_{ms1} \\ \tilde{V}_{ms2} \\ \tilde{V}_{ms3} \\ \tilde{I}_{ms1} \\ \tilde{I}_{ms2} \\ \tilde{I}_{ms3} \end{bmatrix} =$$

$$Z_T \tilde{VI}_m = Z_T \begin{bmatrix} \tilde{V}_{m1} \\ \tilde{V}_{m2} \\ \tilde{V}_{m3} \\ \tilde{I}_{m1} \\ \tilde{I}_{m2} \\ \tilde{I}_{m3} \end{bmatrix} = \begin{bmatrix} Z_{T11}\tilde{V}_{m1} + Z_{T12}\tilde{V}_{m2} + Z_{T13}\tilde{V}_{m3} + Z_{T14}\tilde{I}_{m1} + Z_{T15}\tilde{I}_{m2} + Z_{T16}\tilde{I}_{m3} \\ Z_{T21}\tilde{V}_{m1} + Z_{T22}\tilde{V}_{m2} + Z_{T23}\tilde{V}_{m3} + Z_{T24}\tilde{I}_{m1} + Z_{T25}\tilde{I}_{m2} + Z_{T26}\tilde{I}_{m3} \\ Z_{T31}\tilde{V}_{m1} + Z_{T32}\tilde{V}_{m2} + Z_{T33}\tilde{V}_{m3} + Z_{T34}\tilde{I}_{m1} + Z_{T35}\tilde{I}_{m2} + Z_{T36}\tilde{I}_{m3} \\ Z_{T41}\tilde{V}_{m1} + Z_{T42}\tilde{V}_{m2} + Z_{T43}\tilde{V}_{m3} + Z_{T44}\tilde{I}_{m1} + Z_{T45}\tilde{I}_{m2} + Z_{T46}\tilde{I}_{m3} \\ Z_{T51}\tilde{V}_{m1} + Z_{T52}\tilde{V}_{m2} + Z_{T53}\tilde{V}_{m3} + Z_{T54}\tilde{I}_{m1} + Z_{T55}\tilde{I}_{m2} + Z_{T56}\tilde{I}_{m3} \\ Z_{T61}\tilde{V}_{m1} + Z_{T62}\tilde{V}_{m2} + Z_{T63}\tilde{V}_{m3} + Z_{T64}\tilde{I}_{m1} + Z_{T61}\tilde{I}_{m2} + Z_{T66}\tilde{I}_{m3} \end{bmatrix},$$

wherein $\tilde{VI}_m$ is the measurement point, $\tilde{V}_{mi}$ is the voltage value of the measurement point, and $\tilde{I}_{mi}$ is the current value of the measurement point;

$\tilde{VI}_{ms}$ is the transformed measurement point, $\tilde{V}_{msi}$ is a voltage value of the transformed measurement point, and $\tilde{I}_{msi}$ is a current value of the transformed measurement point; and $Z_{Tij}$ is an (i,j)-th element of the crosstalk cancelation matrix $Z_T$.

18. The meter of claim 16, wherein the crosstalk cancelation function is determined based on a plurality of source points and a plurality of measurement points corresponding to the plurality of source points.

19. The meter of claim 18, wherein the crosstalk cancelation function is determined as a crosstalk cancelation matrix that transforms the plurality of measurement points to the plurality of source points.

20. The meter of claim 18, wherein the plurality of source points are provided by a reference power source device that is independent of the power distribution network.

* * * * *